United States Patent
Azuma

[19]

[11] Patent Number: 5,822,175
[45] Date of Patent: Oct. 13, 1998

[54] ENCAPSULATED CAPACITOR STRUCTURE HAVING A DIELECTRIC INTERLAYER

[75] Inventor: Masamichi Azuma, Colorado Springs, Colo.

[73] Assignee: Matsushita Electronics Corporation, Japan

[21] Appl. No.: 946,947

[22] Filed: Oct. 9, 1997

Related U.S. Application Data

[63] Continuation of Ser. No. 421,544, Apr. 13, 1995, abandoned.

[51] Int. Cl.$^6$ .............................. H01G 4/06; H01G 4/00; H01G 4/008; H01G 4/20
[52] U.S. Cl. ..................................... 361/321.5; 361/301.3; 361/303; 361/305; 361/306.1; 361/306.3; 361/312; 361/313; 361/320; 361/321.1; 361/321.4; 257/296; 257/297; 257/306; 257/310
[58] Field of Search .............................. 361/301.1, 301.3, 361/303–305, 306.1–306.3, 310–313, 320, 321.1–321.5, 322; 365/145, 149; 29/25.42; 438/381, 393–399; 257/295–297, 306–311, 379

[56] References Cited

U.S. PATENT DOCUMENTS

| | | | |
|---|---|---|---|
| 5,206,788 | 4/1993 | Larson et al. ........................... | 361/313 |
| 5,330,931 | 7/1994 | Emesh et al. .............................. | 437/60 |
| 5,355,277 | 10/1994 | Hoshiba .................... | 361/313 |
| 5,506,748 | 4/1996 | Hoshiba ................ | 361/321.4 |
| 5,576,222 | 11/1996 | Arai et al. .................. | 437/60 |

OTHER PUBLICATIONS

Authors: M. Azuma et al.; Title: Electrical Characteristics of High Dielectric Constant Materials for Integrated Ferroelectrics; Date: 1992.

Authors: E. Fujii et al.; Title: ULSI Dram Technology With Ba0.7sr0.3TiO3 Film of 1.3nm Equivalent SiO2 Thickness and 10–9A/cm2 Leakage Current; Date: Dec. 1992; Place of Publication: International Electron Device Meeting (IEDM).

*Primary Examiner*—Bot L. Ledynh
*Attorney, Agent, or Firm*—Amster, Rothstein & Ebenstein

[57] ABSTRACT

An encapsulated capacitor structure and method for fabricating same. The capacitor structure is created by selectively depositing a lower electrode, a dielectric thin film of BST or other ferrodielectric, and an upper electrode, onto a substrate, and subsequently depositing a conformal layer of a non-reductively deposited dielectric material. Contact windows are then opened through the encapsulating layer for contacting the capacitor electrodes. The underlying structure is protected by the encapsulating layer from metal deposition and post-processing which would otherwise damage the structure.

8 Claims, 4 Drawing Sheets

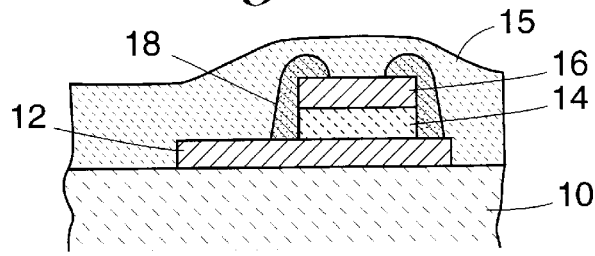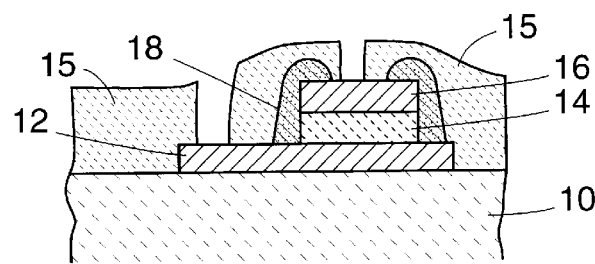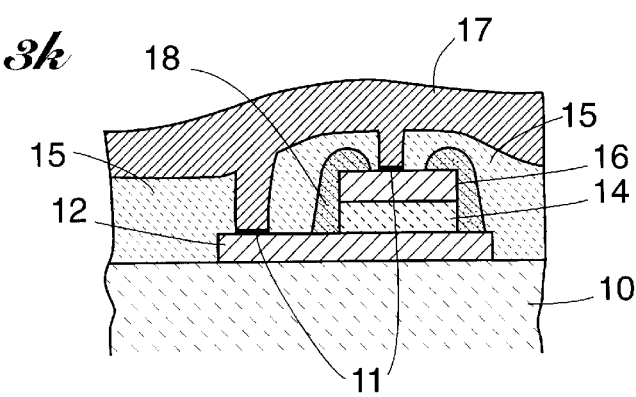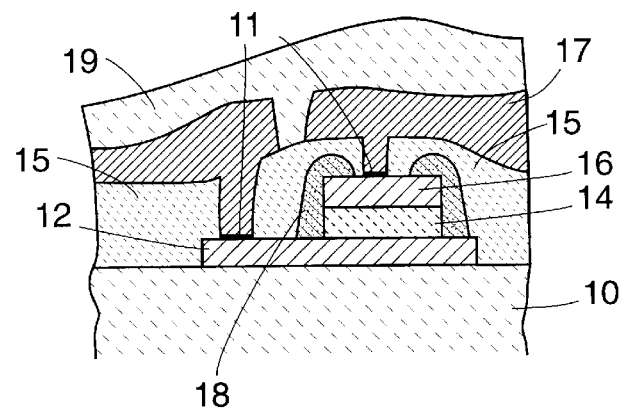

ENCAPSULATED CAPACITOR STRUCTURE HAVING A DIELECTRIC INTERLAYER

This application is a continuation of application Ser. No. 08/421,544 filed on Apr. 13, 1995, now abandoned.

FIELD OF THE INVENTION

The present invention is related to U.S. patent application Ser. No. 08/286,801 filed Aug. 4, 1994, which is a divisional application of Ser. No. 08/136,029 filed Oct. 14, 1993, now abandoned. The teachings of these applications are expressly incorporated by reference herein.

The present invention relates to a method and structure for providing an encapsulated high capacitance structure in a small area. More particularly, a BST capacitor structure capped with a dielectric layer to insulate the capacitor materials from subsequent processing is taught, along with the processing steps for fabrication thereof.

BACKGROUND OF THE INVENTION

In the art of semiconductor circuit manufacture, it is desirable to provide very fast components in the smallest total area. When fabricating such circuitry, limitations are encountered due to the physical constraints imposed by the equipment and processing capabilities and also as a result of the inherent physical properties of the materials and their properties under the processing conditions. Factors which contribute to constraints on fabrication include adhesion of desired metal and dielectric materials to the substrate materials and to other adjacent layer materials, temperature stability given the processing requirements of the related materials, chemical processing stability, deposition and etching processing requirements for the individual material and, of course, electrical compatibility of the materials.

In the fabrication of capacitor structures, as illustrated in FIG. 1A, one successively deposits films of a conductive material comprising a first electrode 12, a dielectric material sandwich layer 14, and a second layer of conductive material comprising the second electrode 16, onto a substrate 10. One particularly advantageous combination of materials for superior capacitor performance comprises a $BaTiO_3$—$SrTiO_3$ solid solution (the so-called "BST") based capacitor, wherein layer 14 comprises the BST solid solution. Once the three-layer capacitor structure has been fabricated, at least one cleaning step is conducted, followed by further processing steps, including electrical connection to the upper capacitor electrode. The cleaning step is necessary for removing any residual resists after patterning of the materials comprising the capacitor structures. A commonly used $H_2O$ cleaning step is referred to as a "dump rinse" which involves "washing" the exposed surface by subjecting it to 100% $H_2O$. Water is poured onto the surface to flush away, and thereby remove, any residual resist. Since, generally the resist includes heavy metal contamination, each step of the patterning process include a water cleaning resist strip process. Details of the foregoing are found with reference to *VLSI Fabrication Principles* by S. K. Ghandhi, John Wiley & Sons (N.Y., 1983) pages 517–520. The $H_2O$ cleaning step is followed by a drying step, to remove water from the surface of the structure, frequently by spin drying in an $N_2$ or dry air ambient. Generally, it is also necessary to conduct a subsequent reduction step, using a reduction ambient such as $H_2$, whereby any of the electrode metal, which has become oxidized as a result of exposure to the $H_2O$ during the cleaning process, will be reduced back into conductive metal (i.e., $O_2$ removed to return the metal oxide to metal).

Not only the surface electrode metal is exposed to the cleaning, drying and reducing ambients, however. The entire cross-section of the capacitor, as illustrated in FIG. 1A, is exposed to the post-fabrication processing. A difficulty encountered, as a result of the post-fabrication processing to which the capacitor structure is exposed, is the degradation of properties of the materials comprising the three-layer capacitor. In particular, the materials which are best suited to be used for the intermediate dielectric sandwich layer are susceptible to degradation due to exposure to moisture and due to penetration of ambient gases commonly used for the post-fabrication cleaning and processing steps. As taught in the patent application referenced above, ferroelectric materials which have perovskite structures, including lead titanate, lead titanate doped with niobium, lead titanate doped with manganese, lead zirconate titanate, lanthanum-doped lead zirconate titanate and lead nicobate can all be used in place of the earlier-noted barium strontium titanate.

Clearly, exposed metal oxidation is only one of the concerns attendant to the dump rinse resist removal process. In addition, particularly in the processing of capacitors having ferroelectric sandwich layers, the humidity sensitivity of the BST or other layered films results in gradual peeling of the layered film. Moreover, the ferroelectrics are also sensitive to the reduction ambient, which is used not only for post-rinsing reduction of oxidized metal but also as the sintering ambient, after aluminum has been deposited, for electrical connection to the upper capacitor electrode. Post-metallization annealing in forming gas ($N_2$–$H_2$, 1–25% $H_2$) in the temperature range of 350°–500° C. is standard for aluminum circuit line sintering (see, e.g., *Silicon Processing In The VLSI Era*, Vol. 1, by S. Wolf and R. N. Tauber, Lattice Press (1986), p. 518). The foregoing processing sensitivities of the BST based capacitor has limited their use for silicon-based integrated circuits. While PZT and PLZT capacitors can be prone to processing damage, as well, these structures do not exhibit the sensitivity of the otherwise preferred BST structure.

By way of example, a cleaning process involving $H_2O$ in as low as a 30% humidity concentration will cause $H_2O$ to penetrate into the dielectric layer which, at 30% concentration of $H_2O$, will no longer exhibit good dielectric characteristics and may, in fact, act as a conductor. Exposure of the materials to a subsequent drying step cannot remove the $H_2O$ from the dielectric and can cause further degradation of the capacitor structure.

It is, therefore, one of the objectives of the present invention to provide a superior capacitor structure which is impervious to degradation via exposure to post-fabrication processing.

It is a further objective of the invention to provide a method for fabricating an encapsulated capacitor structure.

It is yet another objective of the invention to provide a high capacity encapsulated capacitor structure in a small area on a semiconductor substrate.

SUMMARY OF THE INVENTION

These and other objectives are realized by the present invention wherein a metal electrode-dielectric film-metal electrode capacitor structure, fabricated on a silicon, gallium arsenide, or other substrate, is encapsulated by a layer of material which is impervious to degradation during subsequent processing. The pattern in the encapsulating layer exposes only the portion of the surface of those electrodes to which subsequent electrical connection must be made. Cleaning, drying, reducing and metal deposition processing steps to which that exposed portion of the surfaces of the electrodes are subjected will not penetrate the encapsulating layer and will not, therefore, adversely affect the underlying upper electrode, dielectric layer, lower electrode or substrate areas. By encapsulating the capacitor, the maximum capacitive properties of the combination of materials can be preserved regardless of the post-fabrication processing required to connect the capacitor to other integrated circuit components.

BRIEF DESCRIPTION OF THE INVENTION

The invention will be described in further detail with reference to the Figures wherein:

FIGS. 3A–3L illustrate an inventive process flow for arriving at the inventive encapsulated multilayer capacitor structure.

DETAILED DESCRIPTION OF THE PREFERRED EMBODIMENT

Figure 1A:
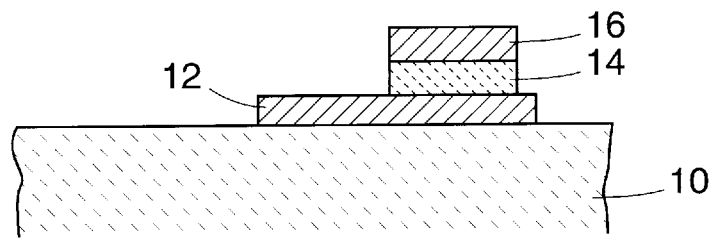
FIGS. 1A and 1B illustrate a typical semiconductor capacitor structure fabricated on a substrate.
Figure 1B:
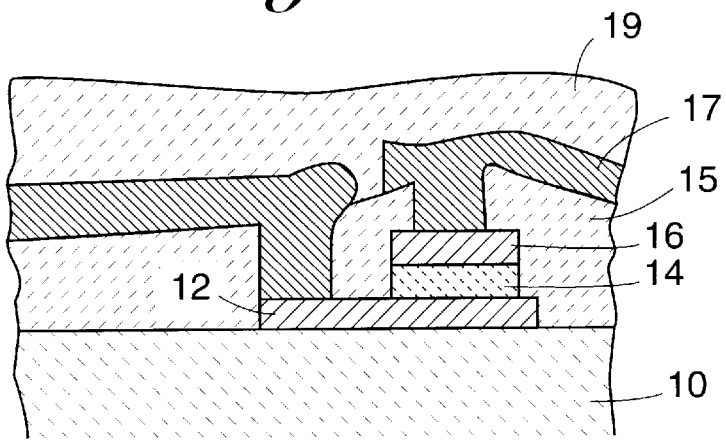

A capacitor structure, in accordance with the present invention, comprises an electrode-dielectric-electrode structure, layers 12-14-16, deposited on a substrate 10, as shown in FIG. 1A or on at least one adhesion/diffusion barrier layer on a substrate, as taught by the aforementioned co-pending patent application. As noted therein, a barrier layer (not shown) of lead titanate, tantalum, titania silicide or tantalum silicide may also be incorporated into the structure under the first electrode, 12. FIG. 1B illustrates the structure of FIG. 1A after further fabrication process steps have been conducted, including: deposition and contact window etching of inter-layer dielectric 16; deposition and patterning of aluminum (Al) metal 17 (frequently preceded by deposition and patterning of a metal barrier layer between the electrodes 12, 16, and the Al 17); and deposition of passivation layer 19. It is during the above fabrication process steps that the BST or other ferrodielectric layer can break down (i.e., degrade or delaminate) due to exposure to processing materials.

Figure 2:
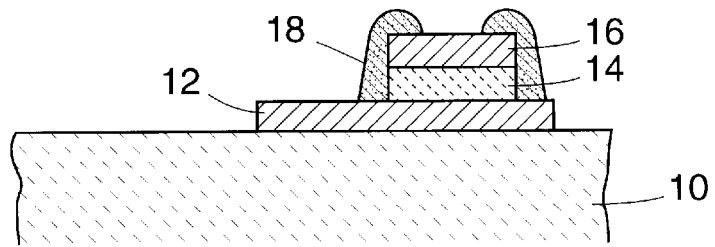
FIG. 2 illustrates an encapsulated capacitor structure in accordance with the present invention.

As illustrated in FIG. 2, the structure of an optimal capacitor made in accordance with the present invention includes substrate 10, lower electrode, 12 selectively deposited on a portion of the surface of the substrate, dielectric sandwich layer, 14 selectively deposited on the lower electrode, upper electrode, 16, and an encapsulating layer, 18, which covers all of the multilayer capacitor structure except for a portion of the surface of the upper electrode to which electrical connection is to be made.

While the crux of the invention lies in the encapsulating layer, the capacitor structure and the method for fabricating it will be detailed herein for the sake of completeness. The choice of encapsulating layer and the method by which the layer is formed are influenced by both the materials and the process flow used in fabricating the multilayer capacitor structure. As such, some level of detail will be recited for both the method of manufacture and the unique encapsulated capacitor structure.

Preferred materials for substrate 10 include quartz, ceramics and glass ceramics, specifically silicon, gallium arsenide, magnesium oxide, indium antimony, and strontium titanate. For most semiconductor device applications, a substrate of either silicon or gallium arsenide is preferred, given the physical and electrical properties of the materials. Frequently, prior to device fabrication on either a silicon or a gallium arsenide substrate, a conformal dielectric insulation layer may be deposited to provide good adhesion and to act as a diffusion barrier to protect the underlying substrate from chemicals and processes used in the subsequent fabrication steps. Silicon oxide, $SiO_2$, is a preferred material for a diffusion barrier to be deposited over the entire substrate surface prior to fabrication of a capacitor. An $SiO_2$ layer is commonly used as both an adhesion promoter and a diffusion barrier for silicon and gallium arsenide substrates due to its stability and compatibility to the substrate materials, in terms of processing stability (e.g., expansion, adhesion, dielectric integrity, et cetera). As is well-known in the art, an intermediate adhesion layer of silicon nitride is additionally needed between a GaAs substrate and an $SiO_2$ diffusion barrier layer, whereas $SiO_2$ can be deposited directly onto a silicon substrate. These intermediate layers are not illustrated, but are mentioned as details of optimal fabrication which may be implemented by one who is skilled in the art and who is using the materials elsewhere recited herein to fabricate the inventive semiconductor capacitor structure.

The preferred electrode material is one which exhibits superior electrical properties, specifically conductivity, and which adheres well to the material onto which it is directly deposited, as well as to the material deposited onto it, if necessary. Materials of choice for lower electrodes, 12, include titanium, tantalum, tantalum silicide, titanium silicide, platinum, palladium, nickel and nickel silicide. A preferred lower electrode structure may comprise a thin (~200 Å) adhesion layer of titanium, tantalum, nickel, palladium, titanium silicide, tantalum silicide or nickel silicide, with a subsequently deposited thicker layer (~2000 Å) of platinum, each layer being deposited by sputtering.

The dielectric sandwich layer, 14, deposited intermediate the electrode layers is chosen to be compatible with the electrode metals electrically (e.g., dielectric constant of greater than 10, thermally (e.g., thermally stable to 800° C.), and adhesively. Since the dielectric constant of $SiO_2$ is 3.9, layer 14 used therewith should have a dielectric constant greater than 20. With platinum or palladium, a dielectric sandwich layer of a ferroelectric material is preferable, including materials having a perovskite-type structure and related materials such as strontium titanate, barium strontium titanate, lead titanate, lead titanate doped with niobium or manganese, lead zirconate titanate, lanthanum-doped lead zirconate titanate, and lead niobate, among others. A dielectric film which is highly compatible with platinum electrode films is selected from the solid solutions of $BaTiO_3$—$SrTiO_3$ BST, such as $Ba_{0.7}Sr_{0.3}TiO_3$. Generally, such an oxide film is sensitive to hydrogen and, degradation of the electrical properties of the capacitor can be observed after exposure of the dielectric layer not only to an $H_2O$ ambient but also to a reductive atmosphere (e.g., 1% $H_2$, 99% $N_2$ forming gas) which is commonly used in the subsequent semi-conductor processing steps of sintering, etc., as noted above.

The second, or upper, electrode, 16, may be chosen from the group comprising platinum, palladium, nickel. tantalum, tantalum nitride, tungsten, aluminum or molybdenum, since the processing requirements are less stringent for the upper electrode.

The encapsulating layer is preferably a non-reductively deposited dielectric material. The properties of the encapsulating layer include the physical properties of ease of conformal deposition and patterning using agents and temperatures which will not otherwise compromise the integrity of the capacitor materials, and stability under the post-fabrication processing conditions to which the capacitor structure will be exposed. Examples of material which are both compatible with the aforementioned capacitor materials and which exhibit the foregoing stability include a material selected from the group comprising silicon dioxide, silicon nitrate, silicon dioxide doped with phosphorous and/or boron, or a combination of the foregoing. It is advantageous to cover at least the edges of the upper electrode to prevent "leakage" of ambients to the underlying dielectric-electrode-substrate structure, as illustrated in FIG. 2. The conformal layer is patterned to expose only the portion of the surface of the upper or lower electrode of the capacitor to which subsequent electrical connection must be made, see layer 18 of FIG. 2.

The structure and method will be further described with specific reference to materials and processing techniques which are well known in the semiconductor processing technology. Clearly, equivalent materials and processing techniques may be substituted, and the related parameters adjusted as is well within the purview of one having skill in the art, while still practicing the invention as herein described and claimed. In the interest of fully disclosing, yet not unduly complicating the disclosure of the present invention, only one material and/or process will hereafter be noted, with the understanding that all equivalents are contemplated thereby.

The method for fabricating the capacitor structure of the present invention is illustrated in FIGS. 3A–3L. The processing steps are illustrated and will be discussed with specific reference to such fabrication on a Si substrate. It will be apparent to one having skill in the art that the processing steps will be the same for another choice of substrate, with such minor modification as would be required by the materials and which would be readily implemented by one skilled in the semiconductor fabrication technology. And further, as noted above, obvious equivalents for materials and processing are envisioned although not specifically recited herein. For example, dielectric materials may be deposited by spinning, sputtering, chemical vapor deposition (CVD), ion beam sputtering, laser beam deposition, molecular beam epitaxy (MBE) and evaporation. Similarly, the patterning steps of depositing a photosensitive resist material, selectively exposing the resist material (presumably through a mask), and removing the exposed resist material with the appropriate solvents (or, in some instances, removing the non-exposed resist material, depending upon whether the resist material-solvent combination is for a "negative" or "positive" resist material) are well-known processing steps, the details of which need not be recited repeatedly. Moreover, selective patterning using physically independent masks through which etching or deposition may be conducted, is also contemplated though not repeatedly recited herein.

Figure 3A:
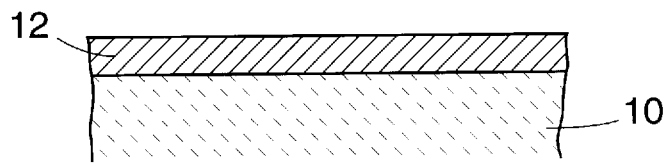
Figure 3B:
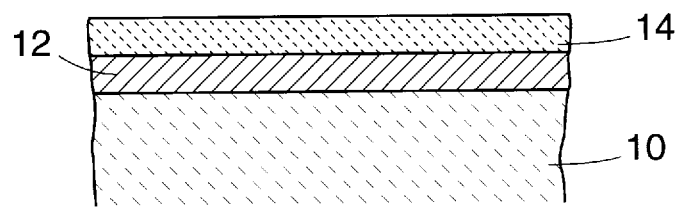

With specific reference to FIGS. 3A–3L, the first electrode material, 12, for example a multilayer electrode of titanium and platinum, is deposited by sputtering at room temperature onto the silicon substrate, 10, at a total film thickness of ~2200 Å, as shown in FIG. 3A. Thereafter, alkoxides of a barium strontium titanate (BST) are applied, at 14, optimally by rotation using a spinner. The deposited alkoxide film is baked in air for a period of 2 to 5 minutes at a temperature of about 400° C. and baked in oxygen for 60 minutes at a temperature of 800° C. resulting in a BST film as illustrated in FIG. 3B.

Figure 3C:
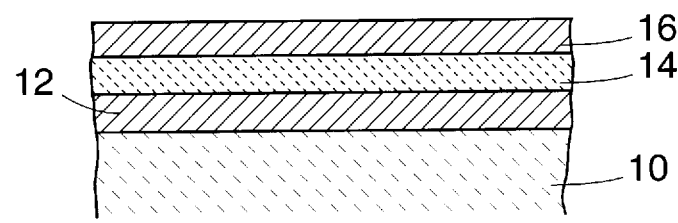
Figure 3D:
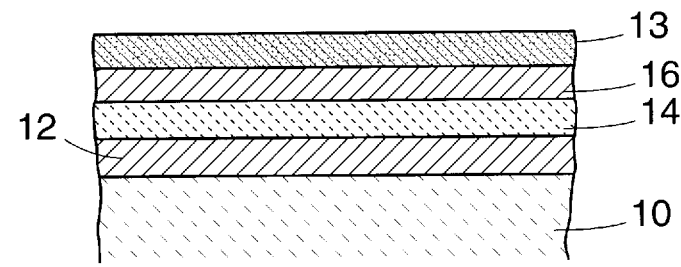

A second platinum film, 16, is then formed on the titanate layer in a film thickness of 150–200 nm by sputtering at room temperature and patterned in accordance with the foregoing and in accordance with known techniques. FIG. 3C illustrates the resulting structure.

Figure 3E:
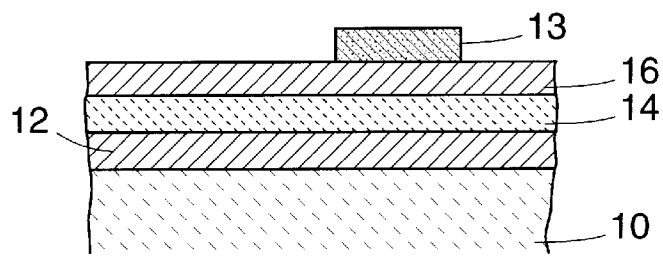
Figure 3F:
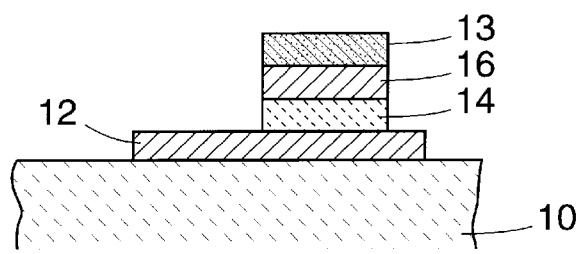

Successive deposition of the coextensive layers of lower electrode metal, dielectric material and upper electrode metal is followed by trimming of the capacitor structure to the desired dimensions, by deposition of first patterned mask 13, FIG. 3E, and a first etching step to etch layers 16 and 14, followed by deposition of a second patterned mask (not shown) and a second etching step to arrive at the profile illustrated in FIG. 3F.

Another fabrication flow which may be envisioned is the deposition of the lower electrode metal, dielectric material and upper electrode material through a resist pattern which is deposited directly onto and patterned on the substrate surface to result in a bottom electrode corresponding in size to the pattern in the resist, followed by subsequent processing as above.

Typically, as discussed in the Background section, the multilayer capacitor structure is next exposed to cleaning processes to remove residual resist material, solvents, etc. and to prepare the surface of the upper electrode for deposition of connecting metallurgy. The cleaning processes involve the independent steps of the dump rinse of the capacitor structure by exposure to an $H_2O$ ambient, drying the structure and reducing any oxidized metal by exposure to a reducing ambient. Upon completion of the cleaning processes, another resist pattern would be formed in order to define, or selectively expose, a portion of the surface of the upper or lower electrode for the ensuing connection steps, as noted with reference to FIG. 1B.

Figure 3G:
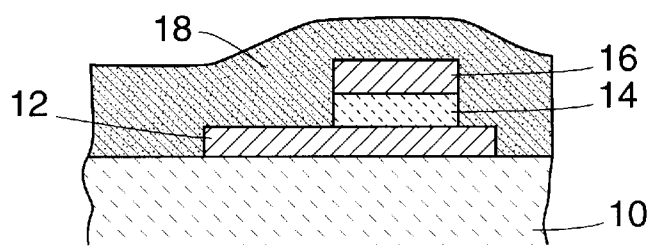
Figure 3H:
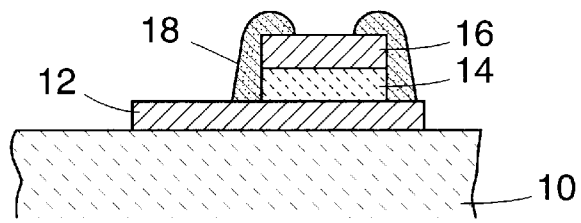

In accordance with the present invention, however, the resist pattern is formed prior to conducting the cleaning steps. As illustrated at FIG. 3G, a photoresist material 18 is conformally deposited on the substrate and the multilayer capacitor. The resist is patterned, in accordance with known techniques, to yield the structure shown at FIG. 3H. Once the resist has been patterned, to expose only that portion of the surface of the upper electrode which is needed for connection to other components, the resist material is left in place to encapsulate the rest of the multilayer capacitor structure and protect it from the subsequent processing conditions.

At this point, the cleaning and related drying and reducing steps may be conducted. Ambients cannot penetrate the encapsulating layer and will not, therefore, be able to degrade the properties of the capacitor. After the cleaning processes have been conducted on the exposed portion of the surface of the upper electrode, inter-layer dielectric 15 is deposited at 3I. The inter-layer dielectric, for example a phosphorous-doped silicon glass, is then patterned to open contact windows to the upper electrode 16 and lower electrode 12, as illustrated at FIG. 3J. As mentioned with regard to FIG. 1B, deposition of an aluminum layer 17 may be preceded by deposition and patterning of a barrier layer of titanium/titanium nitride, shown as layer 11 of FIG. 3K. Patterning of the Al layer is then followed by deposition and annealing of the passivation layer 19 to arrive at the structure of FIG. 3L.

The underlying BST or other ferroelectric layer 14 has been protected, throughout the semi-conductor processing steps, by the encapsulating layer 18, thereby insuring device integrity (at least to the extent that the device integrity is affected by the BST).

Although several specific embodiments of the invention have been described and illustrated herein, it will be understood that the invention is not limited to the disclosed embodiments. A user may implement such modifications and substitutions as are known to one having skill in the art without departing from the spirit and scope of the present invention.

What is claimed is:

1. A capacitor structure comprising:
   a substrate;
   a first metal film deposited on said substrate;
   a dielectric thin film deposited on said first metal film;
   a second metal film deposited on said dielectric thin film;
   a single encapsulating layer selectively deposited on said first metal film, said dielectric thin film, and said second metal film, and covering exposed surfaces of said dielectric thin film and peripheral surfaces of said second metal film; and
   an interlayer dielectric covering surfaces of said single encapsulating layer and said peripheral surfaces of said first metal film.

2. The capacitor structure of claim 1 wherein said first metal film, said dielectric thin film and said second metal film are selectively deposited on a portion of said substrate and wherein said encapsulating layer is conformally deposited on remaining portions of said substrate.

3. The capacitor structure of claim 2 wherein said thin film of dielectric material is a ferroelectric material.

4. The capacitor structure of claim 3 wherein said ferroelectric material has a perovskite type structure.

5. The capacitor structure of claim 4 wherein said ferroelectric material having a perovskite type structure is chosen from the group consisting of barium strontium titanate, strontium titanate, lead titanate, lead titanate doped with niobium, lead titanate doped with manganese, lead zirconate titanate, lanthanum doped lead zirconate titanate, and lead niobate.

6. The capacitor structure of claim 2 wherein said first and said second metal films comprise a metal selected from the group consisting of platinum and palladium.

7. The capacitor structure of claim 2 wherein said first metal film comprises a metal selected from the group consisting of platinum and palladium and said second metal film comprises a metal selected from the group consisting of platinum, palladium, tantalum, tantalum nitride, tungsten, aluminum and molybdenum.

8. The capacitor structure of claim 7 wherein said encapsulating layer comprises a material selected from the group consisting of silicon dioxide, silicon nitrate, silicon dioxide doped with phosphorous, silicon dioxide doped with boron, and combinations thereof.

* * * * *